US00RE45932E

(19) United States
(12) Reissued Patent
Fujii

(10) Patent Number: US RE45,932 E
(45) Date of Reissued Patent: Mar. 15, 2016

(54) SEMICONDUCTOR DEVICE AND METHOD OF MANUFACTURING THE SAME

(71) Applicant: PS4 Luxco S.a.r.l., Luxembourg (LU)

(72) Inventor: Seiya Fujii, Tokyo (JP)

(73) Assignee: PS4 LUXCO S.A.R.L., Luxembourg (LU)

(21) Appl. No.: 14/278,877

(22) Filed: May 15, 2014

Related U.S. Patent Documents

Reissue of:
(64) Patent No.: 8,178,971
Issued: May 15, 2012
Appl. No.: 12/379,916
Filed: Mar. 4, 2009

(30) Foreign Application Priority Data

Mar. 6, 2008 (JP) ..... 2008-056842

(51) Int. Cl.
*H01L 23/52* (2006.01)
*H01L 23/498* (2006.01)
*H01L 21/60* (2006.01)

(52) U.S. Cl.
CPC . *H01L 23/49816* (2013.01); *H01L 2021/60022* (2013.01); *H01L 2021/6024* (2013.01); *H01L 2021/60067* (2013.01); *H01L 2021/60262* (2013.01)

(58) Field of Classification Search
CPC ..... H01L 21/4853; H01L 23/49816; H01L 2021/60022; H01L 2021/60067; H01L 2021/60262; H01L 2021/6024
See application file for complete search history.

(56) References Cited

U.S. PATENT DOCUMENTS

| | | | | |
|---|---|---|---|---|
| 6,444,563 | B1 * | 9/2002 | Potter et al. | 438/615 |
| 6,736,306 | B2 * | 5/2004 | Byun et al. | 228/180.22 |
| 6,781,245 | B2 * | 8/2004 | Huang | 257/780 |
| 7,015,590 | B2 * | 3/2006 | Jeong et al. | 257/780 |
| 7,145,247 | B2 | 12/2006 | Kawano et al. | |
| 7,642,632 | B2 * | 1/2010 | Kang | 257/686 |
| 7,683,485 | B2 * | 3/2010 | Nikaido | 257/738 |
| 9,018,761 | B2 * | 4/2015 | Oomori | H01L 21/4853 257/738 |
| 9,018,774 | B2 * | 4/2015 | Lee | H01L 23/3114 257/678 |
| 9,093,322 | B2 * | 7/2015 | Meyer | B81C 1/00301 |
| 9,111,818 | B2 * | 8/2015 | Lin | H01L 23/49811 |
| 2002/0141171 | A1 * | 10/2002 | Bohr | 361/820 |
| 2003/0071284 | A1 * | 4/2003 | Kanai et al. | 257/200 |
| 2003/0092326 | A1 * | 5/2003 | Nishikawa et al. | 439/894 |
| 2004/0017008 | A1 * | 1/2004 | Ueda | 257/734 |
| 2004/0164385 | A1 * | 8/2004 | Kado et al. | 257/678 |

(Continued)

FOREIGN PATENT DOCUMENTS

| | | |
|---|---|---|
| JP | 09-162531 A | 6/1997 |
| JP | 10-012620 A | 1/1998 |

(Continued)

*Primary Examiner* — Deandra Hughes

(57) ABSTRACT

A ball grid array semiconductor device has a wiring substrate (2), a semiconductor chip (6) disposed on one surface side of the wiring substrate, and a bump arrangement (5) as external terminals disposed on a surface side, opposite to the one surface side, of the wiring substrate. The semiconductor chip is mounted so that the center of the semiconductor chip is shifted from the center of the semiconductor device by one pitch or more of the bump arrangement, and the bump arrangement has a reinforcing structure (5-2) for a bump array located at a position farthest from the center of the semiconductor device in a shift direction of the semiconductor chip.

25 Claims, 8 Drawing Sheets

(56) References Cited

U.S. PATENT DOCUMENTS

| | | | | |
|---|---|---|---|---|
| 2005/0093153 | A1* | 5/2005 | Liu | 257/738 |
| 2006/0170102 | A1* | 8/2006 | Ko | 257/738 |
| 2006/0231949 | A1* | 10/2006 | Park et al. | 257/737 |
| 2007/0013083 | A1* | 1/2007 | Kikuchi et al. | 257/786 |
| 2007/0029673 | A1* | 2/2007 | Yamaguchi | 257/737 |
| 2009/0206490 | A1* | 8/2009 | Koide et al. | 257/774 |
| 2013/0043583 | A1* | 2/2013 | Wu et al. | 257/737 |

FOREIGN PATENT DOCUMENTS

| | | | | |
|---|---|---|---|---|
| JP | 2000-138447 | A | | 5/2000 |
| JP | 2001-210749 | A | | 8/2001 |
| JP | 2004-079559 | A | | 3/2004 |
| JP | 2004111543 | A | * | 4/2004 |
| JP | 2005-183934 | A | | 7/2005 |

* cited by examiner

SEMICONDUCTOR DEVICE AND METHOD OF MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS REFERENCE TO RELATED APPLICATIONS*

*The present application is a reissue application of U.S. Pat. No. 8,178,971; the entire contents of which are incorporated herein by reference.*

This application is based upon and claims the benefit of priority from Japanese patent application No. 2008-056842, filed on Mar. 6, 2008, the disclosure of which is incorporated herein in its entirety by reference.

BACKGROUND OF THE INVENTION

1. Field of the Invention

This invention relates to a semiconductor device and, in particular, relates to a semiconductor device improved in strength of a bump array to which thermal stress is particularly applied among bumps that serve as external terminals of the semiconductor device, and further relates to a method of manufacturing such a semiconductor device.

2. Description of the Related Art

Semiconductor devices are widely known having a structure in which a semiconductor chip is mounted on one surface of a wiring substrate and bumps are arranged on the other surface thereof. When a semiconductor device having such a structure is used while being disposed on a mounting board, there are instances where thermal stress is applied to bumps due to a difference in thermal expansion coefficient between a wiring substrate and the mounting board to cause the bumps to fracture, thus leading to the occurrence of connection failure.

Particularly, in a semiconductor device in which a semiconductor chip is mounted so as to be offset or shifted from the center of a wiring substrate for the purpose of ensuring a space for wire bonding, greater thermal stress is applied to a bump array located at a farther position from the center of the wiring substrate in the chip shift direction due to asymmetry of the structure of the device. This will be explained for a BGA (ball grid array) semiconductor device mounted with a plurality of chips, which is illustrated in FIGS. 10 and 11.

In the mounting temperature cycle evaluation of a semiconductor device, fracture of bumps such as solder balls occurs due to the influence of stress generated by a difference in thermal expansion coefficient ($\alpha$) between a wiring substrate 2 and chips 6 forming the semiconductor device or a difference in a between the semiconductor device and a non-illustrated mounting board. This fracture often occurs mainly at bumps 5 disposed at four corners or bumps 5 disposed under chip corners, which are most subjected to stress among all bumps 5 in the generally grid-shaped bump arrangement of the semiconductor device.

More specifically, in the chip shift direction (on the side A in FIG. 10), the chips 6 made of, for example, a low-$\alpha$ silicon are concentrated, and fixed rigidly by the wiring substrate 2 and a sealing body 10 each made of, for example, an epoxy resin having $\alpha$ greater than that of the silicon. Therefore, the bumps 5 disposed under the wiring substrate 2 in the chip shift direction (on the side A in FIG. 10) are largely subjected to stress generated by the difference in $\alpha$ as compared with the bumps 5 disposed in the other place. Particularly, a bump array 5-1 located at a position farthest from the center of the wiring substrate 2 in the chip shift direction is subjected to extremely great stress. As a result, bump fracture tends to occur at this portion and thus the lifetime of those bumps decreases, which shortens the lifetime of the semiconductor device itself.

As shown in FIG. 12, Japanese Unexamined Patent Application Publication (JP-A) No. 2001-210749 (Patent Document 1) discloses a wiring substrate wherein the size of bumps at four corners of the wiring substrate is set greater for increasing the connection strength of those bumps.

On the other hand, as shown in FIG. 13, Japanese Unexamined Patent Application Publication (JP-A) No. Hei 09-162531 (Patent Document 2) discloses a bump arrangement structure wherein the contour of a bump arrangement at the outer peripheral portions of a substrate is set concentric with the center of the substrate to thereby prevent stress from concentrating on specific bumps to cause fracture of those bumps.

These prior art structures are each considered to have some effect against the occurrence of bump fracture at the four corners of the generally grid-shaped bump arrangement, but the effect is not sufficient. This is because it is not necessarily only at the four corners of the semiconductor device where the stress tends to concentrate and cause bump fracture.

Japanese Unexamined Patent Application Publication (JP-A) No. 2005-183934 (Patent Document 3) discloses a multi-chip semiconductor device in which upper and lower chips are bump-connected to each other and the upper chip is disposed so as to be shifted relative to the lower chip, wherein the center of gravity of the upper chip is set to fall within a connecting bump region between the upper and lower chips, thereby improving the connection between the upper and lower chips. However, even if the bump connection between the upper and lower chips in the semiconductor device can be improved, no teaching is given about a measure for improving the bump connection between the semiconductor device and a mounting board.

As another known example of strengthening the bump connection, Japanese Unexamined Patent Application Publication (JP-A) No. 2000-138447 (Patent Document 4) discloses a structure in which lands on the mounting board side each have a concave-convex shape. On the other hand, Japanese Unexamined Patent Application Publication (JP-A) No. 2004-079559 (Patent Document 5) discloses a technique of shifting bump arrays by a half pitch to narrow bump intervals, thereby achieving a high-density bump arrangement.

Japanese Unexamined Patent Application Publication (JP-A) No. Hei 10-012620 (Patent Document 6) discloses a structure in which large-diameter bumps or dummy bumps are disposed as auxiliary bumps at the outer peripheral portions of a bump arrangement.

SUMMARY

However, any of the above related art technologies cannot be said to be a measure against fracture of specific bumps caused by biased stress concentration on those bumps which is generated by disposing a semiconductor chip so as to be shifted in one direction from the center of a wiring substrate.

The present invention provides a semiconductor device with an improved bump structure of a wiring substrate, wherein a semiconductor chip is mounted so as to be shifted from the center of the wiring substrate.

According to one aspect of one embodiment, a ball grid array (BGA) semiconductor device comprises a wiring substrate, a semiconductor chip disposed on one surface side of the wiring substrate, and a bump arrangement as external terminals disposed on a surface side, opposite to the one surface side, of the wiring substrate. The semiconductor chip is mounted so that a center of the semiconductor chip is shifted from a center of the semiconductor device by one pitch or more of the bump arrangement, and the bump arrangement has a reinforcing structure for a bump array located at a position farthest from the center of the semiconductor device in a shift direction of the semiconductor chip.

Preferably, the reinforcing structure is a structure in which dummy bumps are formed on an outer side of the bump array located at the position farthest from the center of the semiconductor device in the shift direction of the semiconductor chip.

Alternatively, the reinforcing structure may be a structure in which a center of the bump arrangement is shifted from the center of the semiconductor device by one pitch or more of the bump arrangement in the shift direction of the semiconductor chip.

The reinforcing structure may be a structure in which lands of the wiring substrate, fixed with the bump array located at the position farthest from the center of the semiconductor device in the shift direction of the semiconductor chip, each have a concave-convex shape.

Alternatively, the reinforcing structure may be a structure in which bumps of the bump array, located at the position farthest from the center of the semiconductor device in the shift direction of the semiconductor chip, are formed to be larger in size than bumps of bump arrays at other positions.

In another embodiment, a ball grid array (BGA) semiconductor device comprises a wiring substrate, a plurality of semiconductor chips disposed on one surface side of the wiring substrate, and a bump arrangement as external terminals disposed on a surface side, opposite to the one surface side, of the wiring substrate; wherein at least one of the plurality of semiconductor chips is mounted so that a center of the at least one of the plurality of semiconductor chips is shifted from a center of the semiconductor device by one pitch or more of the bump arrangement, the bump arrangement has a reinforcing structure for a bump array located at a position farthest from the center of the semiconductor device in a shift direction of the at least one of the plurality of semiconductor chips, and the plurality of semiconductor chips have a stacked structure in which the semiconductor chips are mounted so as to be shifted farther from the center of the semiconductor device as the semiconductor chips are located farther from the wiring substrate in a stacking direction.

In a further embodiment, there is provided a method of manufacturing ball grid array (BGA) semiconductor devices each comprising a wiring substrate, a plurality of semiconductor chips disposed on one surface side of the wiring substrate, and a bump arrangement as external terminals disposed on a surface side, opposite to the one surface side, of the wiring substrate. The method comprises the steps of: preparing a wiring base substrate having a plurality of wiring substrate regions arranged in a matrix; and forming a chip-mounted wiring base substrate having a semiconductor chip on one surface side of each of the wiring substrate regions of the wiring base substrate, the semiconductor chip disposed so as to be shifted in one direction with respect to a position which is to be a center of a semiconductor device. The method further comprises forming a multichip-mounted wiring base substrate by stacking another semiconductor chip so as to be shifted in the one direction with respect to the semiconductor chip in each of the wiring substrate regions of the chip-mounted wiring base substrate; forming a sealed wiring base substrate by covering entirely the semiconductor chips of the multichip-mounted wiring base substrate with a sealing resin; forming a bump-mounted wiring base substrate having a bump arrangement on a surface side, opposite to the one surface side where the semiconductor chips are stacked, of each of the wiring substrate regions of the sealed wiring base substrate, the bump arrangement having a reinforcing structure for a bump array located at a position farthest in the one direction from the position which is to be the center of the semiconductor device; and dicing the bump-mounted wiring base substrate into pieces for the wiring substrate regions, respectively, to provide the semiconductor devices.

According to this invention, in a semiconductor device having a structure in which a semiconductor chip is largely shifted to one side, a bump arrangement has a reinforcing structure for a bump array located at a position farthest from the center of the semiconductor device in a shift direction of the semiconductor chip and, therefore, it is possible to relax stress concentration on specific bumps or strengthen those specific bumps.

In an embodiment, since a bump arrangement has a reinforcing structure for a bump array located at a position farthest from the center of a semiconductor device in a shift direction of a semiconductor chip, it is possible to relax stress concentration on specific bumps or strengthen those specific bumps.

BRIEF DESCRIPTION OF THE DRAWINGS

The above features and advantages of the present invention will be more apparent from the following description of certain preferred embodiments taken in conjunction with the accompanying drawings, in which:

FIGS. 3a-1, 3b-1, 3a-2, 3b-2, 3a-3, 3b-3, 3c, 3d, and 3e are sectional views for explaining manufacturing processes of semiconductor devices each according to the first embodiment of this invention;

DETAILED DESCRIPTION OF EXEMPLARY EMBODIMENTS

Embodiments of this invention will be described with reference to the drawings.

First Exemplary Embodiment

Figure 1:
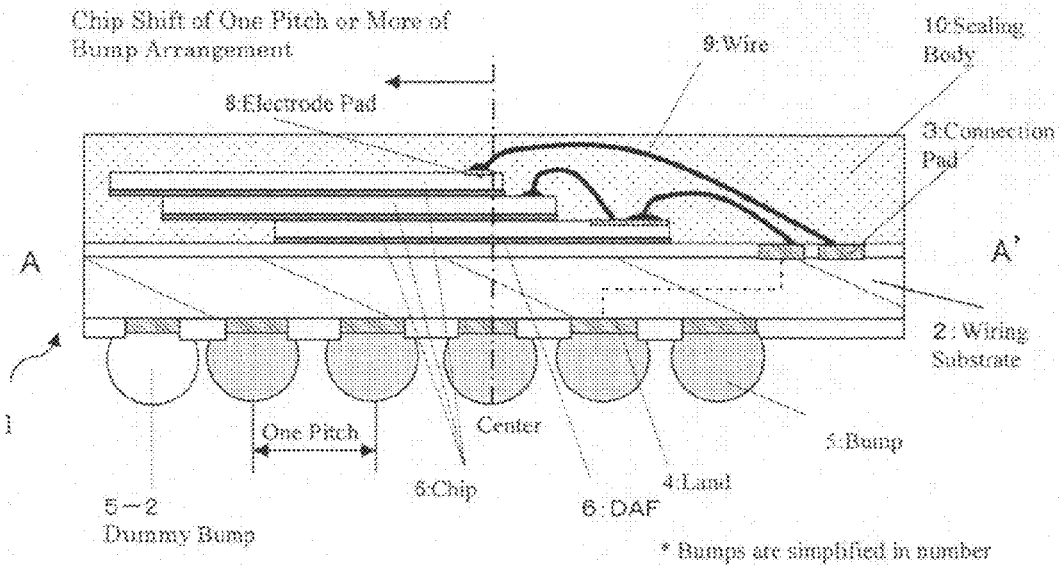
FIG. 1 is a sectional view of a semiconductor device according to a first embodiment of this invention.
Figure 2:
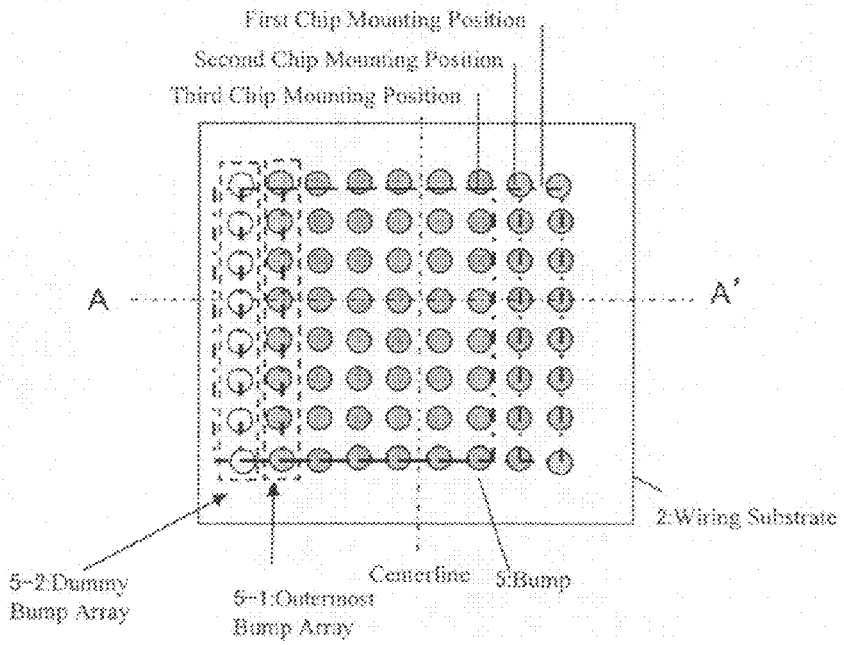
FIG. 2 is a plan view of the semiconductor device of FIG. 1 as seen from its lower side.

FIG. 1 is a sectional view of a semiconductor device according to a first embodiment of this invention. FIG. 2 is a plan view of the semiconductor device of FIG. 1 as seen from its terminal surface side.

The semiconductor device, generally denoted by numeral 1, of the first embodiment comprises a generally square wiring substrate 2. The wiring substrate 2 is, for example, a glass epoxy substrate with a thickness of 0.25 mm and is formed with predetermined wiring patterns. A plurality of connection pads 3 are formed on one surface of the wiring substrate 2. Further, a plurality of lands 4 are formed on the other surface of the wiring substrate 2. The connection pads 3 and the corresponding lands 4 are electrically connected together by the wiring patterns of the wiring substrate 2. Further, bumps 5 such as, for example, solder balls that respectively serve as external terminals are mounted on the lands 4, respectively.

In FIG. 1, for brevity of illustration, the number of the lands 4 and the bumps 5 on the terminal surface side of the wiring substrate 2 is largely reduced as compared with an actual number thereof, thereby providing a schematic illustration. However, actually, as shown in FIG. 2, the external terminals 5 are arranged in a generally grid pattern at a predetermined interval (pitch) and, in this example, the number thereof is eight in the length direction (vertical direction in FIG. 2) and nine in the width direction (horizontal direction in FIG. 2), including a bump reinforcing structure.

On the one surface of the wiring substrate 2, a plurality of semiconductor chips 6 are fixedly mounted in a stacked manner through an insulating adhesive such as, for example, a DAF (die attach film) 7. For the purpose of ensuring a space for wires 9 that connect the chips 6 and the wiring substrate 2 to each other, there is one or more chips 6 disposed so that the center or centers thereof are largely shifted (shifted by one pitch or more of the bump arrangement) in one direction (to the side A in FIGS. 1 and 2) from the center of the semiconductor device 1. Each semiconductor chip 6 is formed with, for example, a logic circuit or a memory circuit on one surface thereof. Further, a plurality of electrode pads 8 are formed on the one surface of each semiconductor chip 6 at positions near the outer edge thereof.

The electrode pads 8 of the semiconductor chips 6 are electrically connected to the corresponding connection pads 3 of the wiring substrate 2 through the conductive wires 9, respectively, each made of a conductive material such as, for example, Au or Cu.

Further, a sealing body 10 is formed over the one surface of the wiring substrate 2 so as to cover the semiconductor chips 6 and the wires 9. The sealing body 10 is made of a thermosetting resin such as, for example, an epoxy resin.

As described above, the bumps 5 are mounted on the lands 4 formed on the other surface of the wiring substrate 2 whose one surface is covered with the sealing body 10. As also described above, the bumps 5 are arranged as the external terminals in the generally grid pattern at the predetermined interval as shown in FIG. 2.

As shown in FIGS. 1 and 2, this embodiment is configured such that, with respect to an outermost bump array 5-1 disposed at a position farthest from the center of the wiring substrate 2 in the chip shift direction (on the side A in FIGS. 1 and 2), i.e. at a portion where the stress concentrates most, a dummy bump array 5-2 is additionally disposed on a side further away from the center of the wiring substrate 2 in the chip shift direction so as to relax the stress that concentrates on the bump array 5-1, thereby making it possible to prolong the lifetime of the bump array 5-1. This further makes it possible to improve the lifetime of the semiconductor device. The dummy bump array 5-2 is for reinforcing the bump array 5-1, but not for electrical connection to the semiconductor chips 6, and thus does not need to be electrically connected to the semiconductor chips 6.

The relationship among the wiring substrate 2, the semiconductor chips 6, and the bump arrangement in this embodiment will be further described. In the grid-shaped bump arrangement, the bumps 5 are arranged at rectangular grid points, a first arrangement direction is substantially parallel to a first side of the generally square wiring substrate 2, and a second arrangement direction perpendicular to the first arrangement direction is substantially parallel to a second side, perpendicular to the first side, of the wiring substrate 2. Each semiconductor chip 6 has a substantially rectangular shape and is mounted with its mutually perpendicular sides arranged parallel to the first and second sides of the wiring substrate 2, respectively.

Referring now to FIGS. 3a-1, 3b-1, 3a-2, 3b-2, 3a-3, 3b-3, 3c, 3d, and 3e, a manufacturing method of semiconductor devices each according to the first embodiment will be described.

A wiring base substrate for use in manufacturing the semiconductor devices each according to the first embodiment is a substrate made of a glass epoxy material and has a plurality of product forming regions. The product forming regions are arranged in a matrix and dicing lines are formed between the respective product forming regions. Each product forming region defined by the dicing lines will serve as a wiring substrate 2 of each semiconductor device. Each product forming region has the same structure as that of the wiring substrate 2 of the semiconductor device illustrated in FIGS. 1 and 2, wherein a plurality of connection pads 3 are formed along a portion, where a semiconductor chip 6 will be mounted, on one surface side of the product forming region and a plurality of lands 4 are formed so as to be arranged in a grid pattern on the other surface side thereof. The connection pads 3 and the corresponding lands 4 are electrically connected together by wiring patterns. The lands 4 are disposed so that bumps made of, for example, solder balls can be formed on predetermined positions in a later ball mounting process. That is, there is prepared the wiring base substrate having a large number of the product forming regions each formed with the connection pads 3 and the lands 4.

Figures 1, 3A:
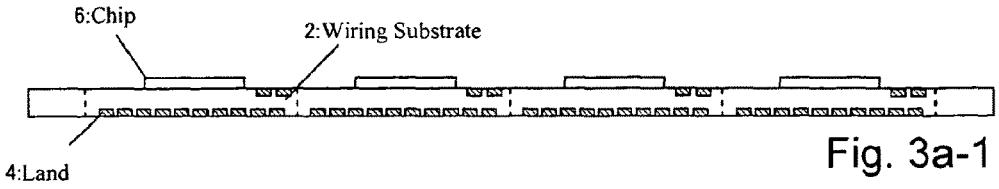

Then, the wiring base substrate is subjected to a die bonding process where, as shown in FIG. 3a-1, a semiconductor chip 6 is mounted at a central portion of each product forming region. The semiconductor chip 6 is fixed on each product forming region through, for example, an insulating adhesive DAF (die attach film) 7 using a non-illustrated die bonding apparatus.

Figures 1, 3B:
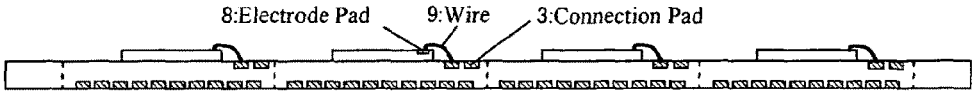
Figures 2, 3A:
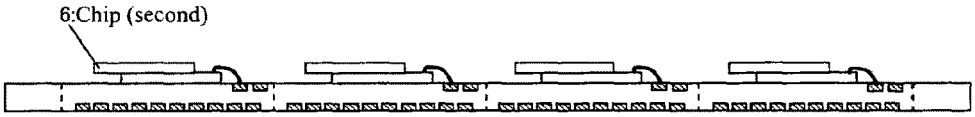
Figures 2, 3B:
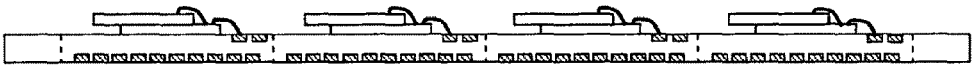
Figures 3, 3A:
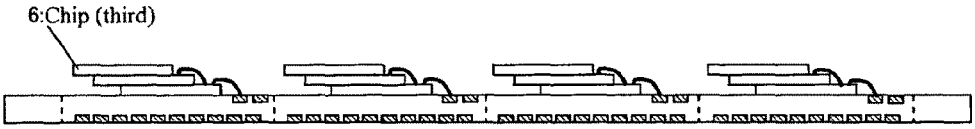
Figures 3, 3B:
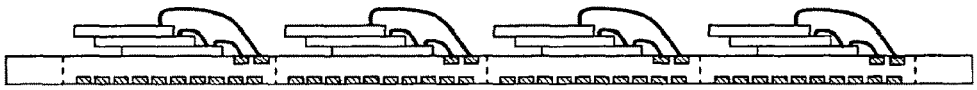

Then, the wiring base substrate having been subjected to the die bonding process is subjected to a wire bonding process where, as shown in FIG. 3b-1, electrode pads 8 of the semiconductor chips 6 and the corresponding connection pads 3 of the wiring base substrate are electrically connected together through conductive wires 9 made of, for example, Au, respectively. The wire bonding is performed in the following manner. That is, using a non-illustrated wire bonding apparatus, a wire melted and formed with a ball at its tip is bonded to the electrode pad 8 by ultrasonic thermocompression bonding, then, while describing a predetermined loop, a rear end of the wire is bonded to the corresponding connection pad 3 by ultrasonic thermocompression bonding, thereby achieving electrical connection between the pads. All the electrode pads 8 and the connection pads 3 are electrically connected together by the wires 9, respectively.

In the case of a multichip structure, the die bonding process and the wire bonding process are carried out a plurality of times so as to dispose a predetermined number of chips 6 at predetermined positions and to establish wire connection between electrode pads 8 on the predetermined chip 6 and corresponding electrode pads 8 on the predetermined chip 6 or corresponding connection pads 3 on the wiring base substrate in each product forming region. In the case of stacking three chips 6, the die bonding and the wire bonding are repeated in order of FIGS. 3a-2, 3b-2, 3a-3, and 3b-3 after FIGS. 3a-1 and 3b-1.

As another manufacturing method, the die bonding process may be performed in advance for all necessary chips to thereby complete the die bonding process and then the wire bonding process may be performed collectively. In the case of this manufacturing method, it is possible to prevent the occurrence of manufacturing failure of damaging wire-bonded wires by the die bonding operation for second or subsequent chips and to shorten the apparatus setting time by continuously performing the die bonding operation and continuously performing the wire bonding operation.

Figure 3C:
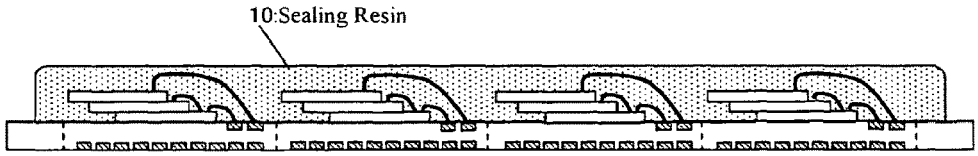

Then, the wiring base substrate having been subjected to the die bonding and the wire bonding is subjected to a molding process. In the molding process, while clamping the wiring base substrate between upper and lower dies of a transfer molding apparatus (not illustrated), a molten sealing resin such as, for example, a molten thermosetting epoxy resin is filled into a cavity between the upper and lower dies and then is heat-cured, thereby forming a sealing portion collectively covering all the product forming regions as shown in FIG. 3c. Using the collective molding, a sealing body 10 can be formed efficiently.

Figure 3D:
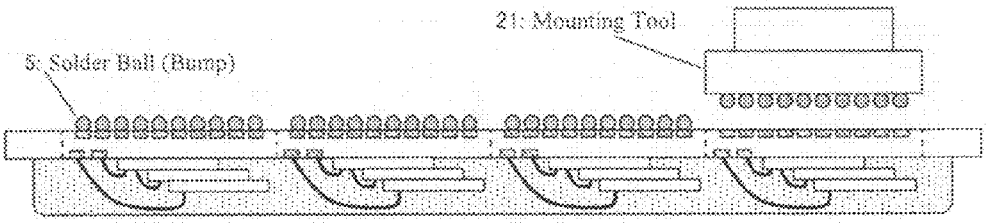

Then, the wiring base substrate formed with the sealing portion is subjected to a ball mounting process. In the ball mounting process, external terminals are formed by mounting solder balls 5 on the lands 4 arranged on the other surface side of the wiring base substrate as shown in FIG. 3d. In the ball mounting process, for example, using a mounting tool 21 of a ball mounter, the solder balls 5 are vacuum-sucked and then mounted on the lands 4 of the wiring base substrate through flux. Thereafter, by applying reflow to the wiring base substrate, the solder balls 5 are fixedly joined to the lands 4 so that the bumps 5 are formed.

Figure 3E:
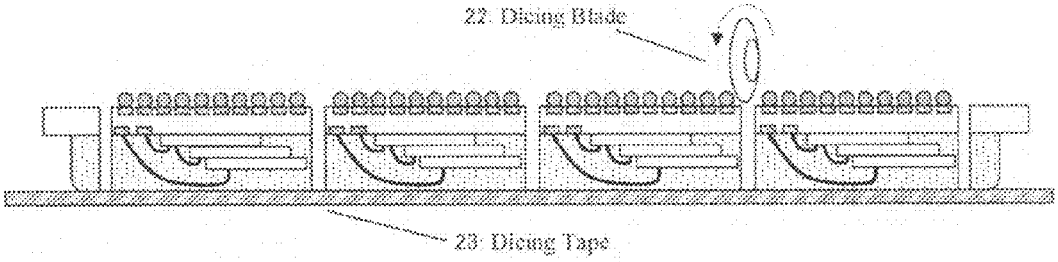

Then, the wiring base substrate formed with the bumps 5 is subjected to a substrate dicing process. In the substrate dicing process, as shown in FIG. 3e, the sealing portion is fixedly bonded to a dicing tape 23 and then the wiring base substrate is ground along the dicing lines by a dicing blade 22 rotating at high speed, thereby cutting and separating the wiring base substrate into pieces corresponding to the respective product forming regions. Thereafter, by picking up the cut and separated pieces from the dicing tape 23, there are obtained semiconductor devices each as shown in FIGS. 1 and 2.

Second Exemplary Embodiment

Figure 4:
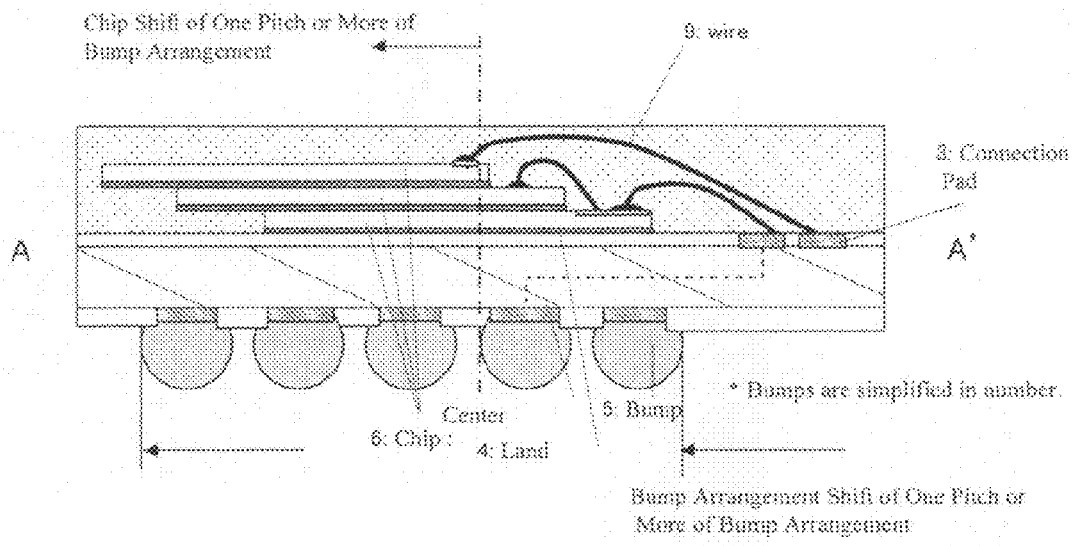
FIG. 4 is a sectional view of a semiconductor device according to a second embodiment of this invention.
Figure 5:
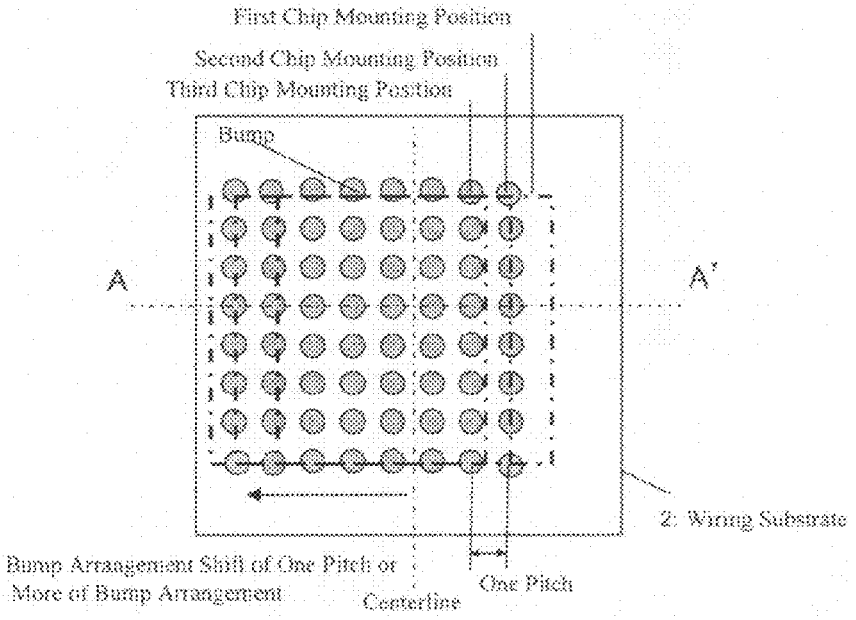
FIG. 5 is a plan view of the semiconductor device of FIG. 4 as seen from its lower side.

FIG. 4 is a sectional view of a semiconductor device according to a second embodiment of this invention and FIG. 5 is a plan view of the semiconductor device of FIG. 4 as seen from below.

In FIG. 4, for brevity of illustration, the number of lands 4 and bumps 5 on the terminal surface side of a wiring substrate 2 is largely reduced as compared with an actual number thereof, thereby providing a schematic illustration. However, actually, as shown in FIG. 5, the bumps are arranged in a matrix with eight bumps in the vertical direction (FIG. 5) and eight bumps in the horizontal direction (FIG. 5).

Referring to FIGS. 4 and 5, in this embodiment, for the purpose of relaxing stress to a bump array 5-1 disposed at a position farthest from the center of the semiconductor device in a shift direction of a semiconductor chip 6 (by one pitch or more of the bump arrangement), i.e. at a portion where the stress concentrates most, the bump arrangement in its entirety is shifted by one pitch or more of the bump arrangement from the center of the semiconductor device in the same direction as the chip shift direction. Since the number of the bumps increases at a portion where the stress concentrates due to the chip shift, the stress can be dispersed and relaxed and, therefore, it is possible to improve the lifetime of the outermost bump array 5-1 and thus to improve the lifetime of the semiconductor device.

Third Exemplary Embodiment

Figure 6:
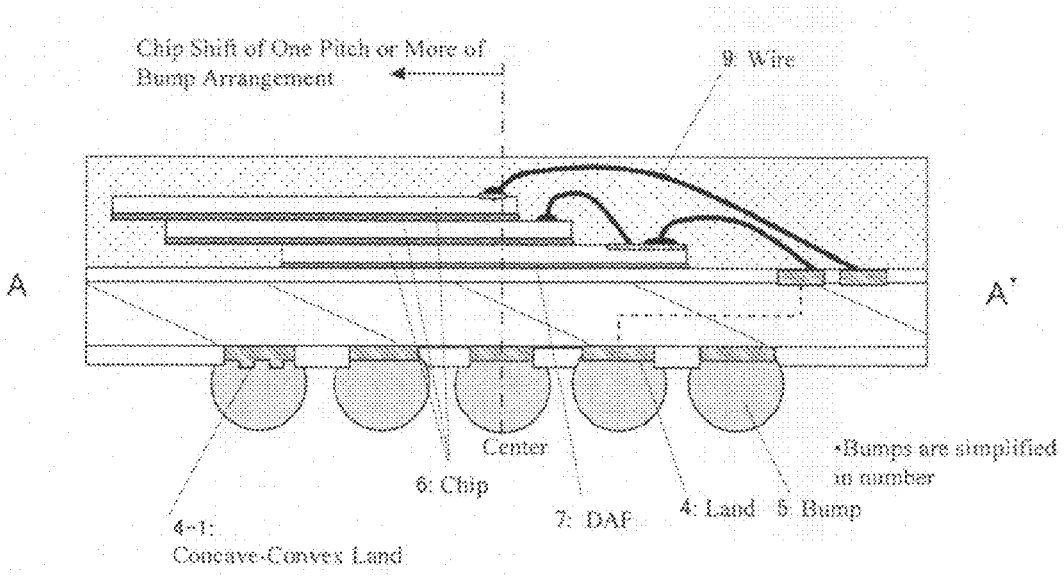
FIG. 6 is a sectional view of a semiconductor device according to a third embodiment of this invention.
Figure 7:
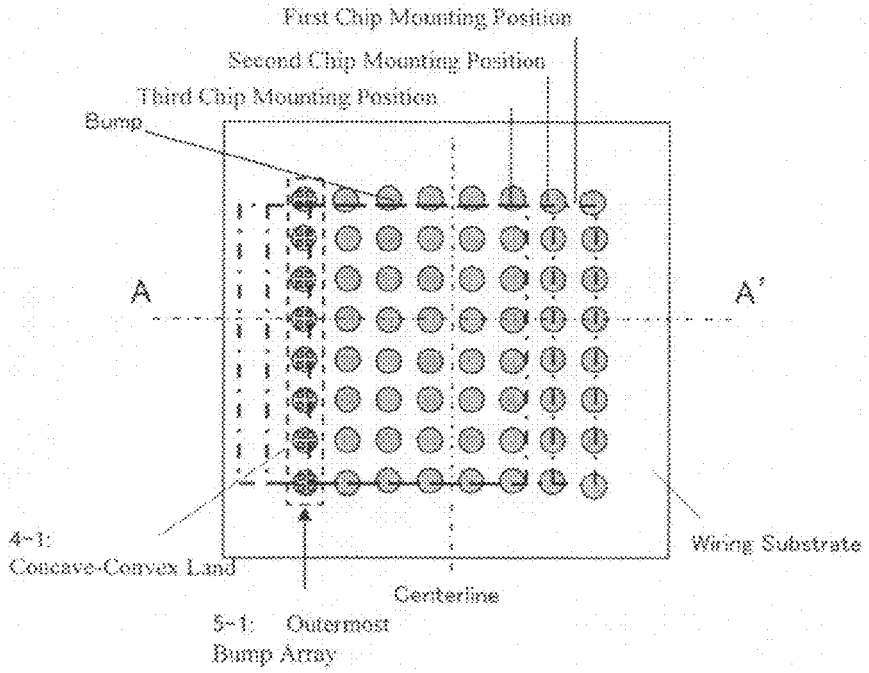
FIG. 7 is a plan view of the semiconductor device of FIG. 6 as seen from its lower side.

FIG. 6 is a sectional view of a semiconductor device according to a third embodiment of this invention and FIG. 7 is a plan view of the semiconductor device of FIG. 6 as seen from below.

In FIG. 6, for brevity of illustration, the number of lands 4 and bumps 5 on the terminal surface side of a wiring substrate 2 is largely reduced as compared with an actual number thereof, thereby providing a schematic illustration. However, actually, as shown in FIG. 7, the bumps are arranged in a matrix with eight bumps in the vertical direction (FIG. 7) and eight bumps in the horizontal direction (FIG. 7).

Referring to FIGS. 6 and 7, in this embodiment, lands 4-1 each have a concave-convex shape, wherein the lands 4-1 correspond to a bump array 5-1 disposed at a position farthest from the center of the semiconductor device in a shift direction of a semiconductor chip 6 (by one pitch or more of the bump arrangement), i.e. at a portion where the stress concentrates most. This makes it possible to increase the bonding strength between the lands 4-1 and the bumps 5-1 and, therefore, it is possible to improve the lifetime of the outermost bump array 5-1 and thus to improve the lifetime of the semiconductor device.

Fourth Exemplary Embodiment

Figure 8:
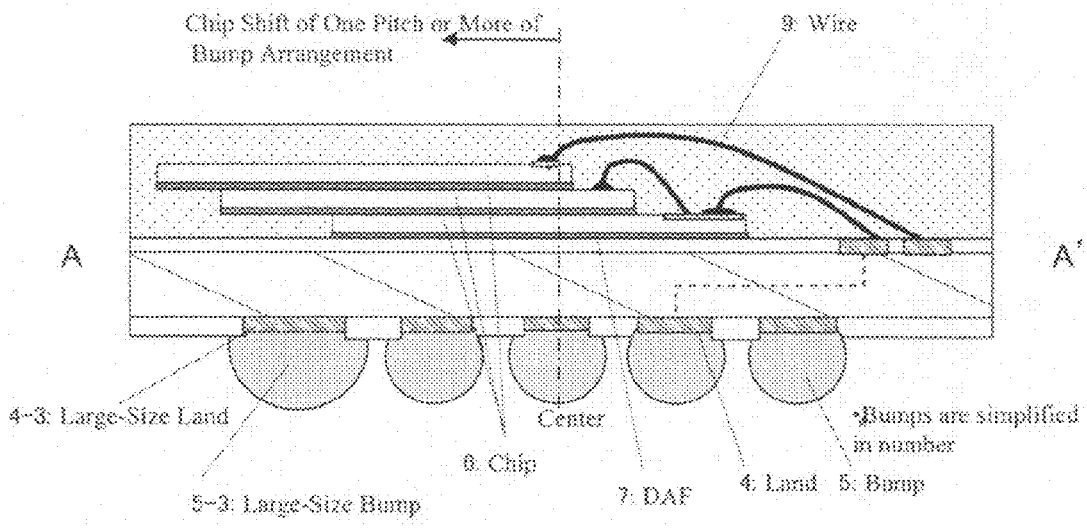
FIG. 8 is a sectional view of a semiconductor device according to a fourth embodiment of this invention.
Figure 9:
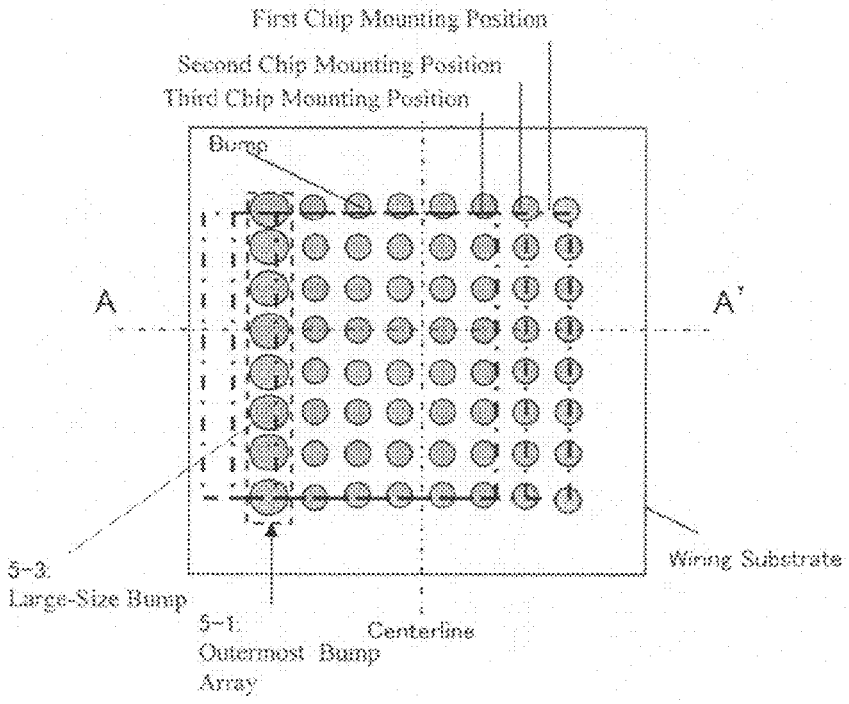
FIG. 9 is a plan view of the semiconductor device of FIG. 8 as seen from its lower side.
Figure 10:
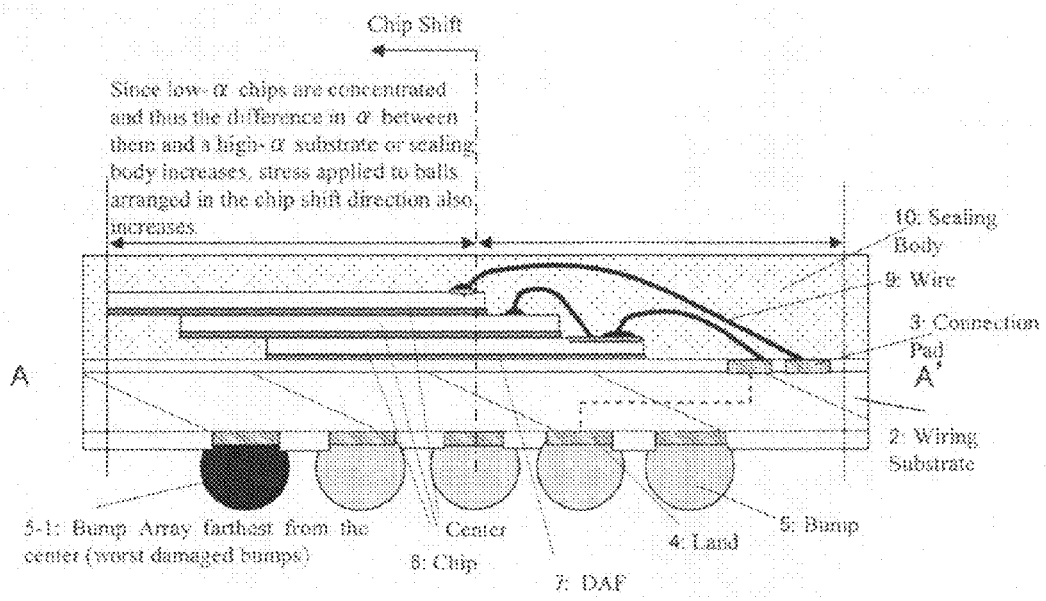
FIG. 10 is a sectional view of a related-art semiconductor device.
Figure 11:
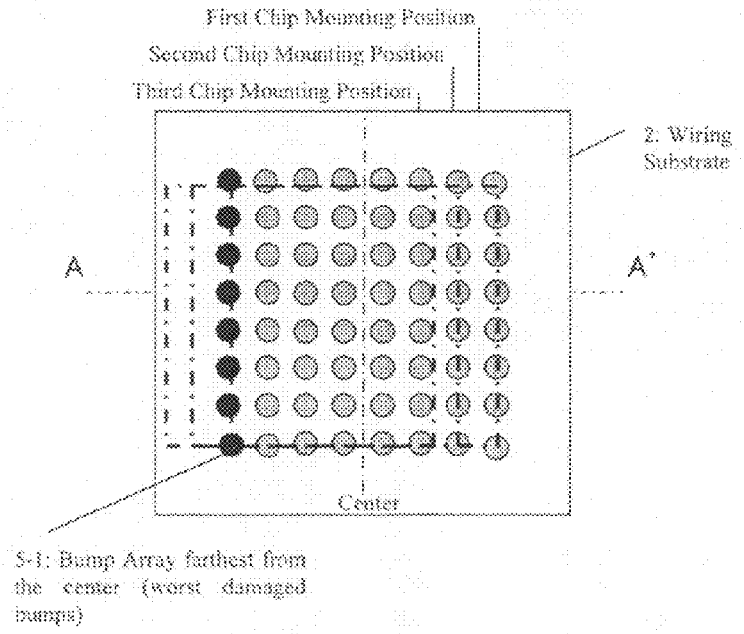
FIG. 11 is a plan view of the semiconductor device of FIG. 10 as seen from its lower side.
Figure 12:
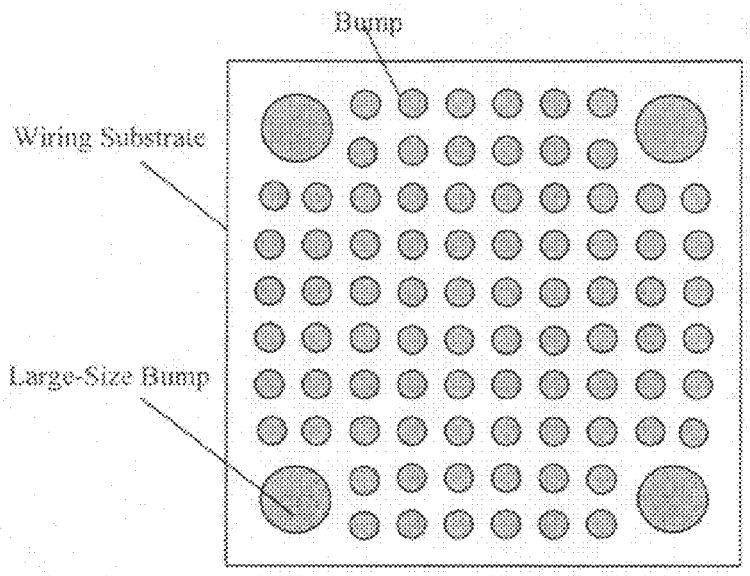
Fig. 12 Prior Art
FIG. 12 is a plan view illustrating a prior art bump arrangement of a wiring substrate.
Figure 13:
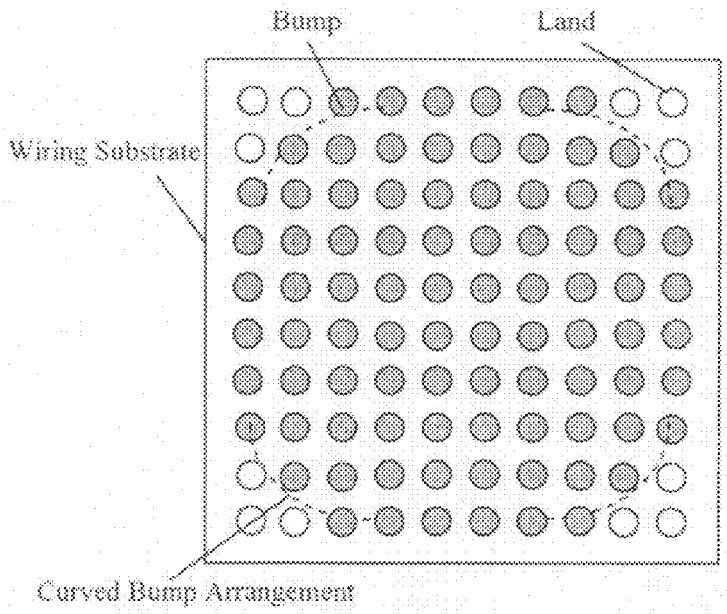
Fig. 13 Prior Art
FIG. 13 is a plan view illustrating another prior art bump arrangement of a wiring substrate.

FIG. 8 is a sectional view of a semiconductor device according to a fourth embodiment of this invention and FIG. 9 is a plan view of the semiconductor device of FIG. 8 as seen from below.

In FIG. 8, for brevity of illustration, the number of lands 4 and bumps 5 on the terminal surface side of a wiring substrate 2 is largely reduced as compared with an actual number thereof, thereby providing a schematic illustration. However, actually, as shown in FIG. 9, the bumps are arranged in a matrix with eight bumps in the vertical direction (FIG. 9) and eight bumps in the horizontal direction (FIG. 9).

Referring to FIGS. 8 and 9, in this embodiment, with respect to a bump array 5-1 disposed at a position farthest from the center of the semiconductor device in a shift direction of a semiconductor chip 6 (by one pitch or more of the bump arrangement), i.e. at a portion where the stress concentrates most, lands 4-3 and bumps 5-3 are formed to be larger in size than the other lands and bumps. This makes it possible to increase the bonding strength between the lands 4-3 and the bumps 5-3 and the bonding strength between the bumps 5-3 and the mounting board side and, therefore, it is possible to improve the lifetime of the outermost bump array 5-1 and thus to improve the lifetime of the semiconductor device.

While the several embodiments have been described above, this invention is not limited thereto, but is applicable to any types of bonding portions such as precoats by solder printing, half bumps, and flip-chip bumps.

Further, there is no limitation to the number of semiconductor chips as long as a semiconductor chip is shifted with respect to the center of a semiconductor device.

Further, in the foregoing embodiments, the reinforcement is carried out only for the outermost bump array in the chip shift direction. However, the reinforcement may also be applied to the second bump array or the second and third bump arrays from the outermost bump array and, in this case, a further lifetime improving effect for a semiconductor device is expected.

According to this invention, particularly in the case of a semiconductor device having a structure in which one or more semiconductor chips are largely shifted to one side like a MCP (multichip package), improvement in reliability of a semiconductor device itself is expected by relaxing biased stress concentration on specific bumps or strengthening those specific bumps.

Further, since this invention relates to a reinforcing structure for a portion where the stress concentrates, the required area on a bump mounting surface of a wiring substrate may remain the same as that on a conventional product and only partial improvement is sufficient for embodying this invention. Therefore, new package development with significant changes such as a change in size is not required and thus it is possible to suppress the cost such as the development cost.

Although this invention has been described in conjunction with exemplary embodiments thereof, it will be appreciated by those skilled in the art that those embodiments are provided for illustrating the invention, and should not be relied upon to construe the appended claims in a limiting sense.

What is claimed is:

1. A semiconductor device comprising:

a wiring substrate including an upper surface, a lower surface opposed to the upper surface, a plurality of connection pads formed on the upper surface so that the connection pads are positioned adjacent to a first side of the wiring substrate;

a first semiconductor chip mounted over the upper surface of the wiring substrate the first semiconductor chip electrically connected to an associated one of the connection pads;

a second semiconductor chip stacked over the first semiconductor chip so that a center of the second semiconductor chip is deviated from a center of the wiring substrate toward a second side opposed to the first side of the wiring substrate, the second semiconductor chip electrically connected to an associated one of the connection pads;

a sealing resin formed on the upper surface of the wiring substrate to cover the first semiconductor chip and the second semiconductor chip; and a plurality of external terminals formed on the lower surface of the wiring substrate, the plurality of external terminals including a first external terminal that is electrically connected to the associated one of the connection pads, and a second external terminal that is not electrically connected to the associated one of the connection pads, the second external terminal being positioned adjacent to the second side of the wiring substrate and under the sealing resin, wherein the second external terminal is arranged adjacent to the second side of the wiring substrate without arranging adjacent to the first side.

2. The semiconductor device according to claim 1, further comprising:

a conductive wire disposed between the connection pad and the first semiconductor chip, the connection pad of the wiring substrate being electrically connected to the first semiconductor chip through the conductive wire.

3. The semiconductor device according to claim 1, wherein the plurality of external terminals are arranged in a grid pattern at a predetermined pitch, the center of the second semiconductor chip is shifted from the center of the wiring substrate to the second side of the wiring substrate by one or more of the predetermined pitch.

4. The semiconductor device according to claim 1, wherein the plurality of the external terminals include a plurality of second external terminals that are positioned along the second side of the wiring substrate.

5. The semiconductor device according to claim 1, wherein the plurality of external terminals include a plurality of first external terminals that are arranged in a grid pattern, and wherein the second external terminals are arranged between the second side of the wiring substrate and a corresponding one of the first external terminals that is arranged nearest to the second side of the wiring substrate.

6. The semiconductor device according to claim 1, wherein an edge of the second semiconductor chip is extended from an edge of the first semiconductor chip to adjacent to the second side of the wiring [board] *substrate* in plan view, and the second external terminal is positioned between the edge of the first semiconductor chip and the edge of the second semiconductor chip in plan view.

7. A semiconductor device comprising:

a wiring substrate including an upper surface, a lower surface opposed to the upper surface, a plurality of connection pads formed on the upper surface so that the connection pads are positioned adjacent to a first side of the wiring substrate;

a first semiconductor chip mounted over the upper surface of the wiring substrate, the first semiconductor chip electrically connected to an associated one of the connection pads;

a second semiconductor chip stacked over the first semiconductor chip so that a center of the second semiconductor chip is deviated from a center of the wiring substrate toward a second side opposed to the first side of the wiring substrate, the second semiconductor chip electrically connected to an associated one of the connection pads;

a scaling resin formed on the upper surface of the wiring substrate to cover the first semiconductor chip and the second semiconductor chip; and a plurality of external terminals formed on the lower surface of the wiring substrate so that the external terminals are arranged in a grid pattern, and a center of the grid pattern is deviated from a center of the wiring [board] *substrate* toward the second side of the wiring substrate.

8. The semiconductor device according to claim 7, further comprising:

a first conductive wire electrically connected the first semiconductor chip to the associated one of connection pads, and a second conductive wire electrically connected the second semiconductor chip to the associated one of the connection pads.

9. The semiconductor device according to claim 7, wherein all of the external terminals are arranged under the sealing resin in plan view.

10. A semiconductor device comprising:

a wiring substrate including an upper surface, a lower surface opposed to the upper surface, a connection pad formed on the upper surface so that the connection pad is positioned adjacent to a first side of the wiring substrate;

a first semiconductor chip mounted over the upper surface of the wiring substrate, the first semiconductor chip electrically connected to an associated one of the connection pads;

a second semiconductor chip stacked over the first semiconductor chip so that a center of the second semiconductor chip is deviated from a center of the wiring substrate toward a second side opposed to the first side of the wiring substrate, the second semiconductor chip electrically connected to an associated one of the connection pads;

a sealing resin formed on the upper surface of the wiring substrate to cover the first semiconductor chip and the second semiconductor chip; and a plurality of external terminals formed on the lower surface of the wiring substrate, the plurality of external terminals including a first external terminal that is electrically connected to the associated one of the connection pads, and a second external terminal positioned adjacent to the second side of the wiring substrate and under the scaling resin, wherein the second external terminal is larger in size than the first external terminal, wherein the second external terminal is arranged adjacent to the second side of the wiring substrate without arranging adjacent to the first side.

11. The semiconductor device according to claim 10, further comprising:

a first conductive wire electrically connected the first semiconductor chip to the associated one of connection pads, and a second conductive wire electrically connected the second semiconductor chip to the associated one of the connection pads.

12. The semiconductor device according to claim 10, wherein the plurality of external terminals include a plurality of second external terminals that are positioned along the second side of the wiring substrate.

13. The semiconductor device according to claim 10, wherein the plurality of external terminals include a plurality of first external terminals that are arranged in a grid pattern, and wherein the second external terminals arc arranged between the second side of the wiring substrate and a corresponding one of the first external terminals that is nearest to the second side of the wiring substrate.

*14. A semiconductor device comprising:*

*a plurality of chips mounted in a stack on a first surface of a substrate, each chip being offset from a lower chip in the direction of a first side of the substrate:*

*a plurality of wires respectively connecting each of the plurality of chips to a plurality of pads on the first surface of the substrate;*

*a sealing resin covering the plurality of chips and the wires on the first surface of the substrate; and*

*a plurality of solder balls mounted on a rectangular array of lands located on a second surface of the substrate opposite the first surface, wherein the plurality of pads are connected to the lands and one or more rows of lands closest to the first side of the substrate have a concave-convex shape different than other lands in the array of lands, and*

*the one or more rows of lands are arranged adjacent to the first side without arranging adjacent to a second side opposed to the first side of the substrate.*

*15. The semiconductor device as claimed in claim 14 wherein the array of lands is centered with respect to the center of the substrate.*

*16. A semiconductor device comprising:*

*a wiring substrate including an upper surface, a lower surface opposed to the upper surface, a plurality of connection pads formed on the upper surface so that the connection pads are positioned adjacent to a first side of the wiring substrate;*

*a first semiconductor chip mounted over the upper surface of the wiring substrate, the first semiconductor chip electrically connected to an associated one of the connection pads;*

*a second semiconductor chip stacked over the first semiconductor chip so that a center of the second semiconductor chip is deviated from a center of the wiring substrate toward a second side opposed to the first side of the wiring substrate, the second semiconductor chip electrically connected to an associated one of the connection pads; and*

*a plurality of external terminals formed on the lower surface of the wiring substrate and electrically connected to the connection pads,*

*wherein the plurality of external terminals are mounted on a rectangular array of lands located on the lower surface of the wiring substrate, wherein the plurality of connection pads are connected to the lands and one or more rows of lands closest to the second side of the substrate have a concave-convex shape different than other lands in the array of lands, and*

*the plurality of external terminals formed on the lower surface of the wiring substrate so that the external terminals are arranged in a grid pattern, and a center of the grid pattern is deviated from a center of the wiring substrate toward the second side of the wiring substrate.*

*17. The semiconductor device as claimed in claim 16 wherein the array of lands is centered with respect to the center of the substrate.*

*18. The semiconductor device as claimed in claim 16 wherein a row of lands closest to the first side of the wiring substrate does not have a concave-convex shape.*

*19. The semiconductor device according to claim 16, further comprising:*

*conductive wires disposed between the connection pads and the first semiconductor chip, the connection pads of the wiring substrate being electrically connected to the first semiconductor chip through the conductive wires.*

*20. The semiconductor device according to claim 16, wherein the plurality of external terminals are arranged in a grid pattern at a predetermined pitch, the center of the second semiconductor chip is shifted from the center of the wiring substrate to the second side of the wiring substrate by one or more of the predetermined pitch.*

*21. A semiconductor device comprising:*

*a wiring substrate including an upper surface, a lower surface opposed to the upper surface, a plurality of connection pads formed on the upper surface, the wiring substrate having a first side;*

*a first semiconductor chip mounted over the upper surface of the wiring substrate the first semiconductor chip electrically connected to an associated one of the connection pads;*

*a second semiconductor chip stacked over the first semiconductor chip so that a center of the second semiconductor chip is deviated from a center of the wiring substrate toward a second side opposed to the first side of the wiring substrate, the second semiconductor chip electrically connected to an associated one of the connection pads; and*

*a sealing resin formed on the upper surface of the wiring substrate to cover the first semiconductor chip and the second semiconductor chip;*

*a plurality of external terminals formed on the lower surface of the wiring substrate and electrically connected to the connection pads,*

*wherein the plurality of external terminals are mounted on a rectangular array of lands located on the lower surface of the wiring substrate, wherein the plurality of connection pads are connected to the lands and one or more rows of lands closest to the second side of the substrate have a concave-convex shape different than other lands in the array of lands, and*

*the one or more rows of lands are arranged adjacent to the second side of the substrate without arranging adjacent to the first side.*

*22. The semiconductor device as claimed in claim 21 wherein the array of lands is centered with respect to the center of the substrate.*

*23. The semiconductor device as claimed in claim 21 wherein a row of lands closest to the first side of the wiring substrate does not have a concave-convex shape.*

*24. The semiconductor device according to claim 21, further comprising:*

*conductive wires disposed between the connection pads and the first semiconductor chip, the connection pads of the wiring substrate being electrically connected to the first semiconductor chip through the conductive wires.*

*25. The semiconductor device according to claim 21, wherein the plurality of external terminals are arranged in a grid pattern at a predetermined pitch, the center of the second semiconductor chip is shifted from the center of the wiring substrate to the second side of the wiring substrate by one or more of the predetermined pitch.*

* * * * *